(12) United States Patent
Minamida et al.

(10) Patent No.: US 11,404,295 B2
(45) Date of Patent: Aug. 2, 2022

(54) SUBSTRATE PROCESSING APPARATUS

(71) Applicant: Tokyo Electron Limited, Tokyo (JP)

(72) Inventors: Junya Minamida, Kumamoto (JP); Tatsuya Ito, Kumamoto (JP); Yasunori Toyoda, Kumamoto (JP); Daisuke Aoki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 587 days.

(21) Appl. No.: 16/269,868

(22) Filed: Feb. 7, 2019

(65) Prior Publication Data
US 2019/0252223 A1 Aug. 15, 2019

(30) Foreign Application Priority Data

Feb. 9, 2018 (JP) .............................. JP2018-022427
Nov. 30, 2018 (JP) .............................. JP2018-225780

(51) Int. Cl.
H01L 21/67 (2006.01)
B65B 55/24 (2006.01)
B65B 31/04 (2006.01)

(52) U.S. Cl.
CPC ........ H01L 21/67201 (2013.01); B65B 31/04 (2013.01); B65B 55/24 (2013.01); H01L 21/67017 (2013.01); H01L 21/67173 (2013.01); H01L 21/67178 (2013.01); H01L 21/67196 (2013.01); H01L 21/67051 (2013.01)

(58) Field of Classification Search
CPC ... B65B 31/04; B65B 55/24; H01L 21/67201; H01L 21/67196; H01L 21/67017; H01L 21/67173; H01L 21/67178; H01L 21/67051
See application file for complete search history.

(56) References Cited

U.S. PATENT DOCUMENTS 5,759,214 A * 6/1998 Ohmi ................... F25J 3/04963
                                                         29/25.01
2009/0181474 A1* 7/2009 Nagai ..................... H01L 28/55
                                                              438/3

(Continued)

FOREIGN PATENT DOCUMENTS

JP          2001-102374 A       4/2001

Primary Examiner — Benjamin L Osterhout
(74) Attorney, Agent, or Firm — Venjuris, P.C.

(57) ABSTRACT

A substrate processing apparatus includes a container carrying in/out section on which a substrate conveyance container accommodating a substrate is placed; a processing unit that performs a process on the substrate; a conveyance space through which the substrate is conveyed; a substrate conveyor that conveys the substrate between the container carrying in/out section and the processing unit through the conveyance space; a first gas supply passage that supplies an atmosphere adjusting gas to the processing unit; a first gas discharge passage that discharges the atmosphere adjusting gas from the processing unit; a circulation passage that returns the atmosphere adjusting gas flowing out from the conveyance space to the conveyance space; a second gas supply passage that supplies the atmosphere adjusting gas to a circulation system constituted by the conveyance space and the circulation passage; and a second gas discharge passage that discharges the atmosphere adjusting gas from the circulation system.

16 Claims, 7 Drawing Sheets

(56) References Cited

U.S. PATENT DOCUMENTS

| | | | |
|---|---|---|---|
| 2009/0297298 A1* | 12/2009 | Okabe | H01L 21/67772 |
| | | | 414/217.1 |
| 2018/0204753 A1* | 7/2018 | Kawai | H01L 21/67772 |
| 2018/0211850 A1* | 7/2018 | Kondoh | H01L 21/67766 |
| 2018/0229945 A1* | 8/2018 | Suzuki | H01L 21/67393 |
| 2018/0254209 A1* | 9/2018 | Kawai | H01L 21/67772 |

* cited by examiner

SUBSTRATE PROCESSING APPARATUS

CROSS-REFERENCE TO RELATED APPLICATIONS

This application is based on and claims priority from Japanese Patent Application Nos. 2018-022427 and 2018-225780 filed on Feb. 9, 2018 and Nov. 30, 2018, respectively, with the Japan Patent Office, the disclosures of which are incorporated herein in their entirety by reference.

TECHNICAL FIELD

The present disclosure relates to a substrate processing apparatus having a function of adjusting an atmosphere around a substrate.

BACKGROUND

Various processes are performed on a substrate such as a semiconductor wafer to manufacture a semiconductor device. When a certain process is performed, the substrate is carried into a substrate processing apparatus in a state of being accommodated in a substrate conveyance container such as a front-opening unified pod (FOUP). Subsequently, the substrate is taken out from the substrate conveyance container by a substrate conveyance device, carried into a processing chamber, and processed therein. Then, the substrate is taken out from the processing chamber by the substrate conveyance device and carried into the original substrate conveyance container.

Due to the air atmosphere in a clean room containing a relatively large amount of oxygen, a problematic level of oxidation may occur on a surface of the substrate. In order to prevent the oxidation, at least a part of the region through which the substrate passes until the substrate is returned to the substrate conveyance container after the substrate is carried out from the substrate conveyance container is made into a low oxygen concentration gas atmosphere (see, e.g., Japanese Patent Laid-Open No. 2001-102374).

There may be a case where the entire region through which the substrate passes until the substrate is returned to the substrate conveyance container after the substrate is carried out from the substrate conveyance container is required to be set to a low oxygen concentration gas atmosphere. In this case, it is necessary to distribute a large amount of low oxygen concentration gas inside the substrate processing apparatus, and as a result, a great amount of factory power is consumed.

SUMMARY

According to an embodiment of the present disclosure, a substrate processing apparatus is provided including: a container carrying in/out section on which a substrate conveyance container accommodating a substrate is placed; a processing unit including a chamber that performs a process on the substrate; a conveyance space through which the substrate is conveyed between the container carrying in/out section and the processing unit; a substrate conveyor configured to convey the substrate between the container carrying in/out section and the processing unit through the conveyance space; a first gas supply passage configured to supply an atmosphere adjusting gas to the processing unit; a first gas discharge passage configured to discharge the atmosphere adjusting gas from the processing unit; a circulation passage connected to the conveyance space and returns the atmosphere adjusting gas flowing out from the conveyance space to the conveyance space; a second gas supply passage configured to supply the atmosphere adjusting gas to a circulation system constituted by the conveyance space and the circulation passage; and a second gas discharge passage configured to discharge the atmosphere adjusting gas from the circulation system.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Figure 1:
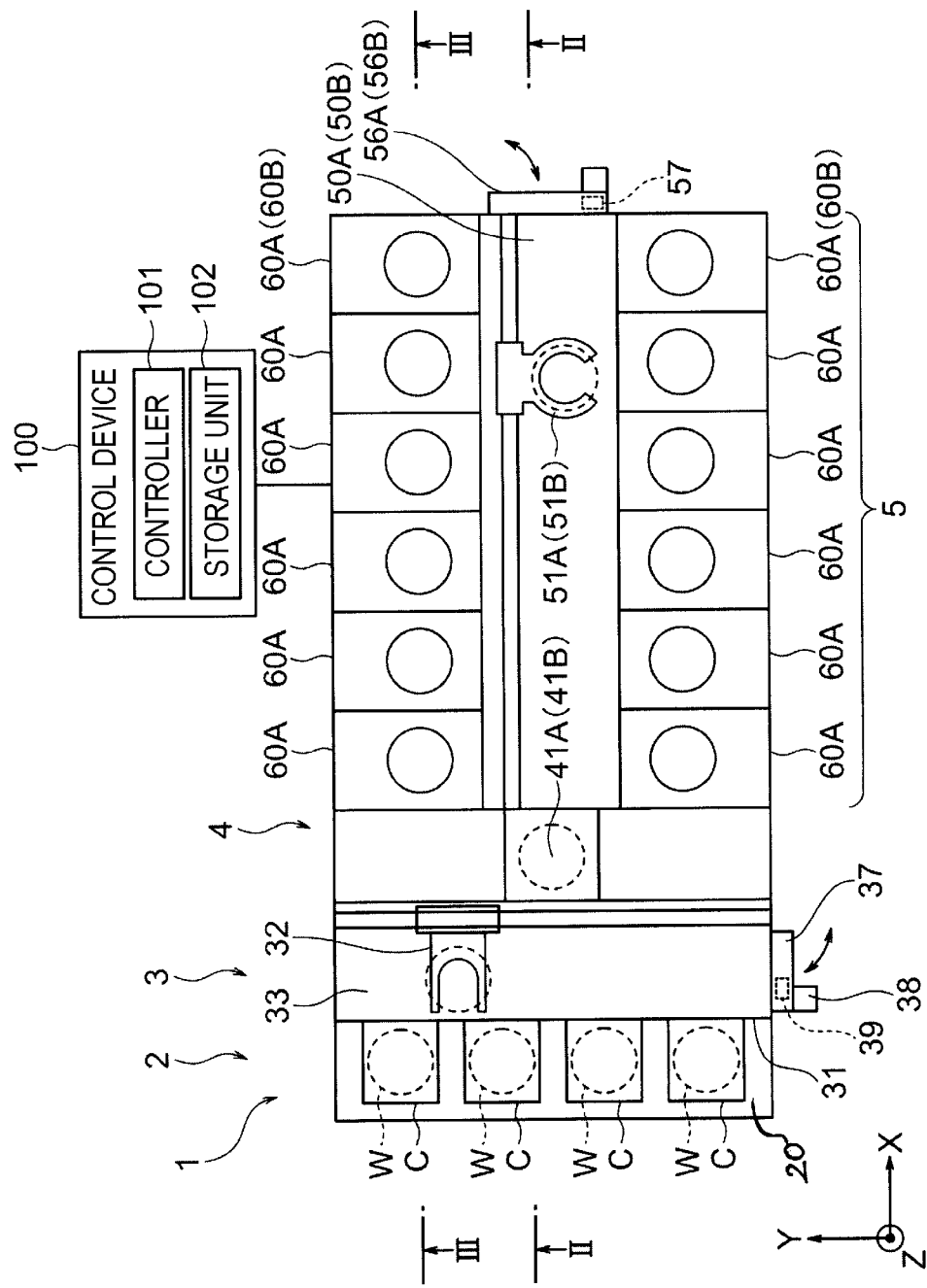
FIG. 1 is a schematic plan view of a substrate processing system according to a first embodiment.

Hereinafter, a substrate processing system as an embodiment of a substrate processing apparatus according to the present disclosure will be described with reference to the accompanying drawings. FIG. 1 is a view illustrating a schematic configuration of a substrate processing system. Hereinafter, in order to clarify positional relationships, the X-axis, the Y-axis, and the Z-axis are defined as being orthogonal to each other. The positive Z-axis direction is regarded as a vertically upward direction.

As illustrated in FIG. 1, a substrate processing system 1 includes a carrying in/out section 2, a first conveyance section 3, an interface section (connection section) 4, and a processing section 5. The first conveyance section 3, the interface section 4, and the processing section 5 are accommodated in a housing that covers the whole substrate processing system 1.

The carrying in/out section 2 includes a container placing portion 20, and a plurality of substrate conveyance containers C (hereinafter, referred to as "containers C") may be placed on the container placing portion 20. Each of the containers C is, for example, a carrier of a type called a front-opening unified pod (FOUP). A plurality of substrates W (e.g., semiconductor wafers) are accommodated at equal intervals in the vertical direction in a horizontal posture in the container C. An outer surface of the container C placed in the container placing portion 20 is exposed to an atmosphere inside a clean room where the substrate processing system 1 is provided.

A plurality of doors are provided on a front panel 31 (see, e.g., FIGS. 1 and 2) of the first conveyance section 3. An unlocking mechanism and a cover adsorption mechanism of a cover (not illustrated) of the container is provided in each door, so that the cover of the container C placed in the container placing portion 20 may be detached. When the cover of the container C is detached, an inner space of the container C communicates with an inner space (a first conveyance space 33 to be described later) of the first conveyance section 3. At this time, since a peripheral edge of an opening portion of the container C and the front panel 31 of the first conveyance section 3 are in close contact, the atmosphere in the clean room does not intrude into the inside of the container C. When the container C accommodating a substrate W is carried into the substrate processing system 1, the inside of the container C is sealed in a nitrogen gas atmosphere. Contents disclosed in this paragraph are well known in the technical field of the semiconductor manufacturing apparatus and are not illustrated in the drawings.

A first substrate conveyance device 32 is provided in the first conveyance section 3. Two transfer units 4A and 4B are provided in the interface section 4. Each of the transfer units 4A and 4B may hold the plurality of substrate W in the vertical direction in the horizontal position. The first substrate conveyance device 32 takes out the substrate W from the container C that is placed in the container placing portion 20 and the cover thereof is detached, and then carries the substrate into one of the two transfer units 4A and 4B. An inner space 33 of the first conveyance section 3 is also referred to as the "first conveyance space 33." In the present specification, the "conveyance space" is regarded as a space to which the substrate W is conveyed by the substrate conveyance device.

The processing section 5 includes an upper portion 5A and a lower portion 5B. Since configurations of the upper portion 5A and the lower portion 5B are substantially the same with each other, descriptions will be made only on the upper portion 5A in many cases in the present specification. A second conveyance space 50A that extends in a front-rear direction (X direction) is formed in a central portion in a left-right direction (Y direction) of the upper portion 5A. A second substrate conveyance device 51A is provided in the second conveyance space 50A. A plurality of processing units 60A are provided in both of the left side and the right side of the second conveyance space 50A, respectively. The second substrate conveyance device 51A may convey the substrate between the upper transfer unit 4A and the plurality of processing units 60A in the upper portion 5A.

Figure 4:
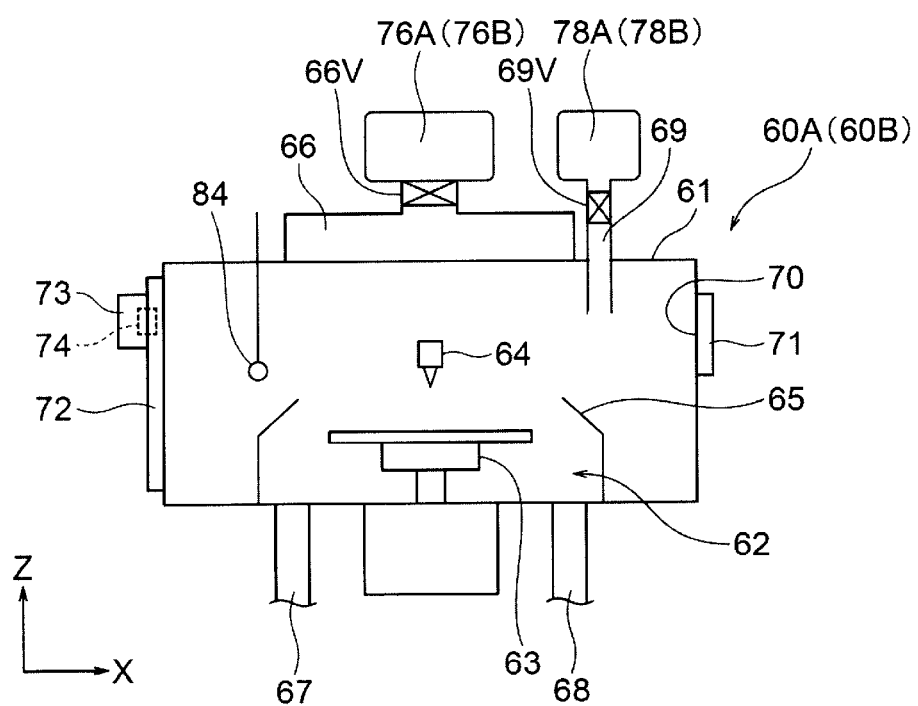
FIG. 4 is a schematic longitudinal section view of a processing unit.

As illustrated in FIG. 4, a processing unit 60A includes a unit casing (chamber) 61 and a processing mechanism 62 arranged in the unit casing 61. In the illustrated embodiment, the processing mechanism 62 includes a spin chuck 63 (substrate holding and rotating mechanism) that rotates the substrate W around the vertical axis while maintaining the substrate W in the horizontal position, a nozzle 64 that supplies processing fluid (e.g., chemical liquid, rinse liquid, or two-fluid) to the substrate W, and a cup body 65 that surrounds the periphery of the substrate W.

The processing unit 60A includes a nitrogen gas supply portion 66 that supplies an atmosphere adjusting gas (in the example, nitrogen gas) to an inner space (processing space) of the unit casing 61, in particular, a space above the substrate W. The nitrogen gas supply portion 66 may be configured as a fan filter unit, and in that case, a downflow of the atmosphere adjusting gas is formed in the processing space.

The cup body 65 is connected with an exhaust passage 67 configured to suck the atmosphere inside the cup body 65 and a drainage passage 68 configured to discharge the processing fluid scattered from the substrate W from the cup body 65. The drainage passage 68 is connected to a waste liquid line of a semiconductor manufacturing factory. A mixed fluid containing the gas that fills the inner space of the unit casing 61 and the processing fluid that is supplied from the nozzle 64 to the substrate W is discharged from the exhaust passage 67.

The processing unit 60A is formed with an air supply port 69 (unit ventilation passage) configured to supply air (here, clean air which is filtered air in the clean room) as a purge gas to the inner space of the unit casing 61.

An opening 70 through which an arm of the second substrate conveyance device MA holding the substrate W passes is provided on the side surface of the unit casing 61 facing the second conveyance space 50A. A shutter 71 is provided in the opening 70. The shutter 71 is opened when the second substrate conveyance device MA carries the substrate into/out from the processing unit 60A. The shutter 71 is closed when a processing W is performed on the substrate in the processing unit 60A, so as to isolate the inner space of the processing unit 60A from the second conveyance space 50A. The shutter 71 may have the same configuration as a gate valve.

A maintenance door 72 that is opened when maintenance of various components of the processing unit 60A is performed is provided on a side surface of the processing unit 60A which is opposite to the shutter 71. A key cylinder 73 and an electromagnetic lock 74 are provided at the maintenance door 72. A state of the processing unit 60A may be switched between a maintenance mode and a processing mode by inserting an operation key into the key cylinder 73 and rotating the operation key by an operator.

An oxygen concentration sensor S4 (see, e.g., FIG. 5) is provided in each processing unit 60A to detect the oxygen concentration in the inner space of the unit casing 61.

Processing units 60B in the lower portion 5B of the processing section 5 have the same configuration as the processing units 60A.

Figure 3:
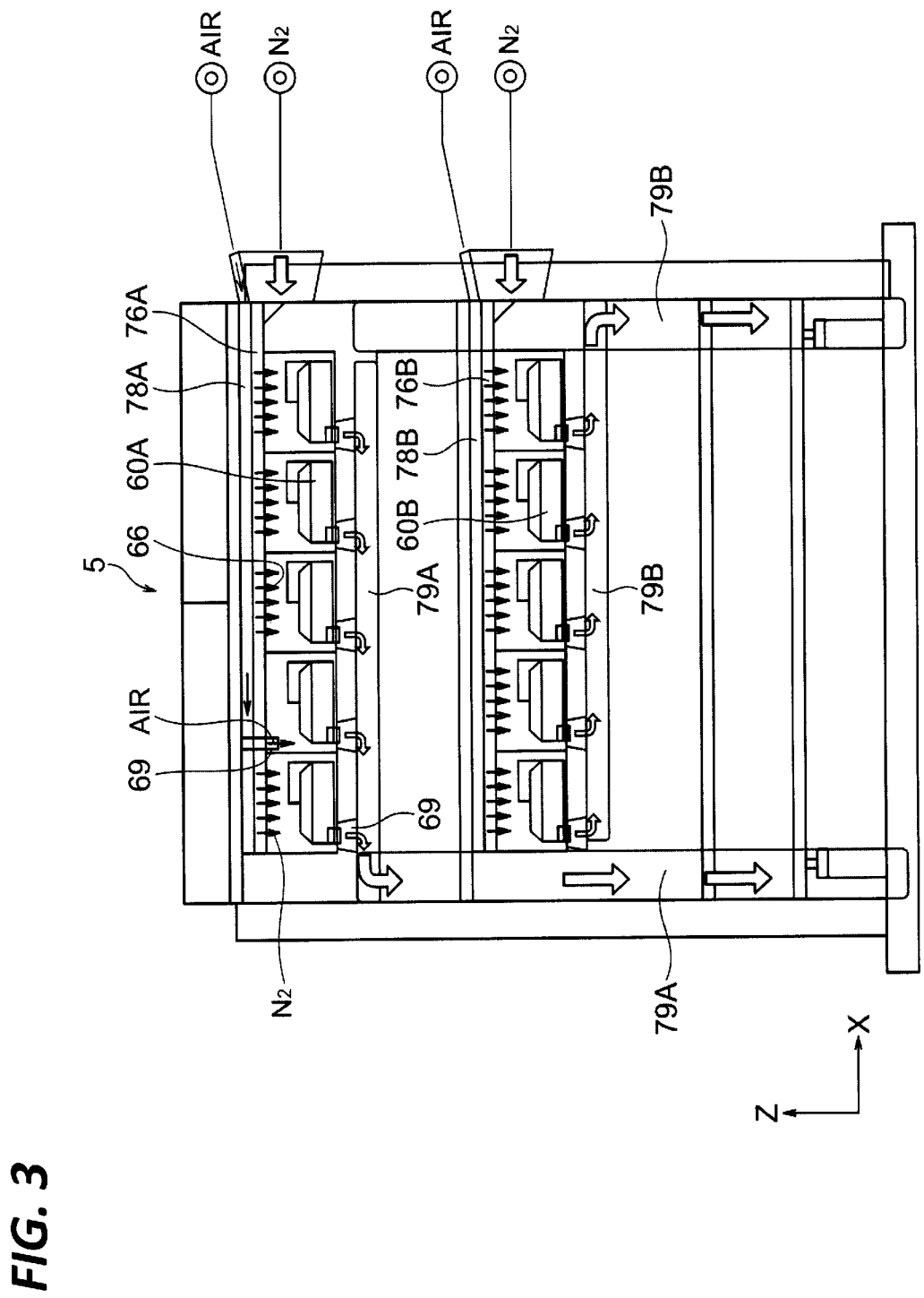
FIG. 3 is a schematic cross-sectional view of the substrate processing system taken along the line of FIG. 1.

As illustrated in FIGS. 3 and 4, a nitrogen gas supply duct 76A is provided in the upper portion of the upper portion 5A of the processing section 5 to supply nitrogen gas as an atmosphere adjusting gas to the nitrogen gas supply portion 66 of the each processing unit 60A in the upper portion 5A. An opening/closing valve 66V is provided between the nitrogen gas supply portion 66 and the nitrogen gas supply duct 76A of the each processing unit 60A. In addition, an air supply duct 78A is provided in the upper portion of the upper portion 5A of the processing section 5 to supply air as a purge gas to the air supply port (ventilation passage) 69 of the each processing unit 60A in the upper portion 5A. An opening/closing valve 69V is provided between the air supply port 69 and the air supply duct 78A of the each processing unit 60A. An exhaust duct 79A is provided in the upper portion 5A of the processing section 5 to allow the gas or the mixed fluid discharged from the exhaust passage 67 of the processing unit 60A to flow therethrough.

A nitrogen gas supply duct 76B, an air supply duct 78B, and an exhaust duct 79B are also provided in the lower portion 5B of the processing section 5 in the same manner as in the upper portion 5A.

The exhaust duct 79A and the exhaust duct 79B extend up to a height position of a floor panel of the housing of the processing section 5.

Figure 2:
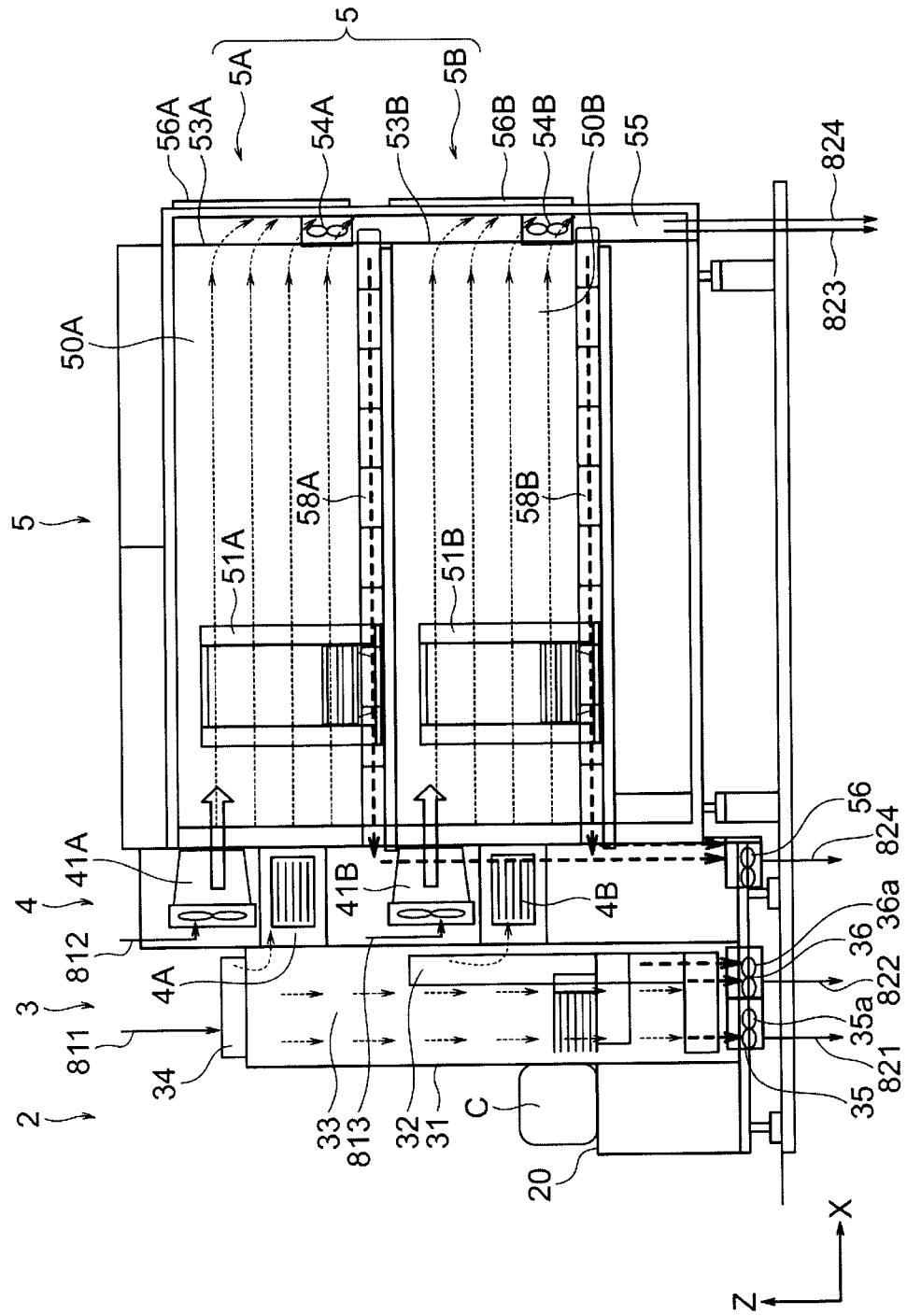
FIG. 2 is a schematic cross-sectional view of the substrate processing system taken along the line II-II of FIG. 1.

A fan filter unit 34 that forms a downflow (flowing in a Z negative direction) of the atmosphere adjusting gas in the first conveyance space 33 is provided in the inner space of the first conveyance section 3, that is, on a ceiling panel among the panels surrounding the first conveyance space 33. An exhaust port 35 is provided on the floor panel among the panels surrounding the first conveyance space 33 to discharge the atmosphere adjusting gas from the first conveyance space 33. As illustrated in FIG. 2, a suction fan 35a may be provided in the exhaust port 35 to promote the exhaust from the first conveyance space 33.

An exhaust port 36 is provided on the floor panel among the panels surrounding the first conveyance space 33 to discharge the atmosphere adjusting gas received into the first substrate conveyance apparatus 32 from the first conveyance space 33 so as to discharge, for example, dust or particles on the surface and inside of the first substrate conveyance apparatus 32. As illustrated in FIG. 2, a suction fan 36a may be provided in the exhaust port 36 to promote the exhaust.

As illustrated in FIG. 1, a maintenance door 37 is provided on a side surface panel on the left side or on the right side among the panels surrounding the first conveyance space 33. The operator may enter into the first conveyance space 33 and perform operations such as the maintenance of the first substrate conveyance device 32 by opening the maintenance door 37.

A key cylinder 38 and an electromagnetic lock 39 are provided at the maintenance door 37. A state of the first conveyance space 33 and the second conveyance spaces 50A and 50B may be switched between a maintenance mode and a processing mode by inserting an operation key into the key cylinder 38 and rotating the operation key by an operator.

As illustrated in FIG. 2, a fan filter unit 41A is provided above the transfer unit 4A of the interface section 4. The fan filter unit 41A ejects the atmosphere adjusting gas into the second conveyance space 50A in the substantially horizontal direction through an opening formed on the side surface panel on the interface section 4 side among the panels surrounding the second conveyance space 50A. Therefore, a sideflow of the atmosphere adjusting gas flowing in an X positive direction in the second conveyance space 50A is formed.

An exhaust port 53A configured to discharge the atmosphere adjusting gas from the second conveyance space 50A is provided on the side surface panel opposite to the interface section 4 among the panels surrounding the second conveyance space 50A. A fan MA may be provided in the vicinity of the exhaust port 53A to promote the discharge of the atmosphere adjusting gas from the second conveyance space 50A. The exhaust port 53A of the second conveyance space 50A in the upper portion and an exhaust port 53B of the second conveyance space 50B in the lower portion are connected to one exhaust duct 55.

As illustrated in FIGS. 1 and 2, maintenance doors 56A and 56B are provided at the end portions of the second conveyance spaces 50A and 50B on the side opposite to the interface section 4, respectively. The operator may enter into the second conveyance space 50A and perform, for example, the maintenance of the second substrate conveyance device 51A by opening the maintenance door 56A. An electromagnetic lock 57 is provided at the maintenance door 56A. The maintenance door 56B has the same configuration and function as that of the maintenance door 56A.

The atmosphere adjusting gas is also received into the second substrate conveyance device 51A from the second conveyance space 50A in order to discharge, for example, dust or particles on the surface and inside of the second substrate conveyance device 51A. An exhaust duct 58A extends to a lower side of the floor panel of the housing of the substrate processing system 1 through inside the interface section 4 and discharges the atmosphere adjusting gas from the second substrate conveyance device 51A.

Regarding the above aspects, the second substrate conveyance device 51B and the second conveyance space 50B are the same as the second substrate conveyance device 51A and the second conveyance space 50A, and have the same type of exhaust duct 58B. A suction fan 56 may be provided at the downstream end of the exhaust ducts 58A and 58B to promote the exhaust.

The first conveyance space 33 always communicates with the second conveyance space 50A in the upper portion through the inner space of the transfer unit 4A in the upper portion of the interface section 4, and also always communicates with the second conveyance space 50B in the lower portion through the inner space of the transfer unit 4B in the lower portion of the interface section 4. That is, it may be considered that the first conveyance space 33, the second conveyance space 50A, and the second conveyance space 50B form one continuous conveyance space. During the normal operation of the substrate processing system 1, the one continuous conveyance space is always isolated from the atmosphere inside the clean room where the substrate processing system 1 is provided. Even when the opening portion in the front panel 31 of the first conveyance section 3 is opened, the atmosphere in the clean room does not intrude into the conveyance spaces 30, 50A, and 50B because the container C is mounted on the opening portion. The second conveyance space 50A in the upper portion and the second conveyance space 50B in the lower portion do not directly communicate with each other, but communicate with each other through the first conveyance space 33.

During the normal operation of the substrate processing system 1, the inner space of the each processing unit 60A is isolated from the second conveyance space 50A, and the inner space of the each processing unit 60B is isolated from the second conveyance space 50B (except when the shutter 71 is opened for carrying the substrate in/out). Further, during the normal operation of the substrate processing system 1, the inner space of each of the processing units 60A and 60B is isolated from the atmosphere in the clean room where the substrate processing system 1 is provided.

Next, descriptions will be made on a gas supply/circulation system that supplies the atmosphere adjusting gas to the first conveyance space 33, the second conveyance spaces 50A and 50B, and the processing units 60A and 60B.

In the present specification, the atmosphere adjusting gas refers to an arbitrary gas capable of making the atmosphere in a space different from the clean air atmosphere (clean air atmosphere) in the clean room when the atmosphere adjusting gas is supplied to the space. The atmosphere adjusting gas is, for example, an inert gas, specifically, nitrogen gas. By supplying the nitrogen gas to the conveyance spaces 30, 50A, and 50B or the inner space of the processing units 60A and 60B, it is possible to make the inner spaces an atmosphere with lower oxygen concentration and lower humidity than the clean air in the clean room. The atmosphere adjusting gas may also be an inert gas other than the nitrogen gas, and may be a dry air having a lower humidity than the clean air in the clean room, or a carbon dioxide gas.

Figure 5:
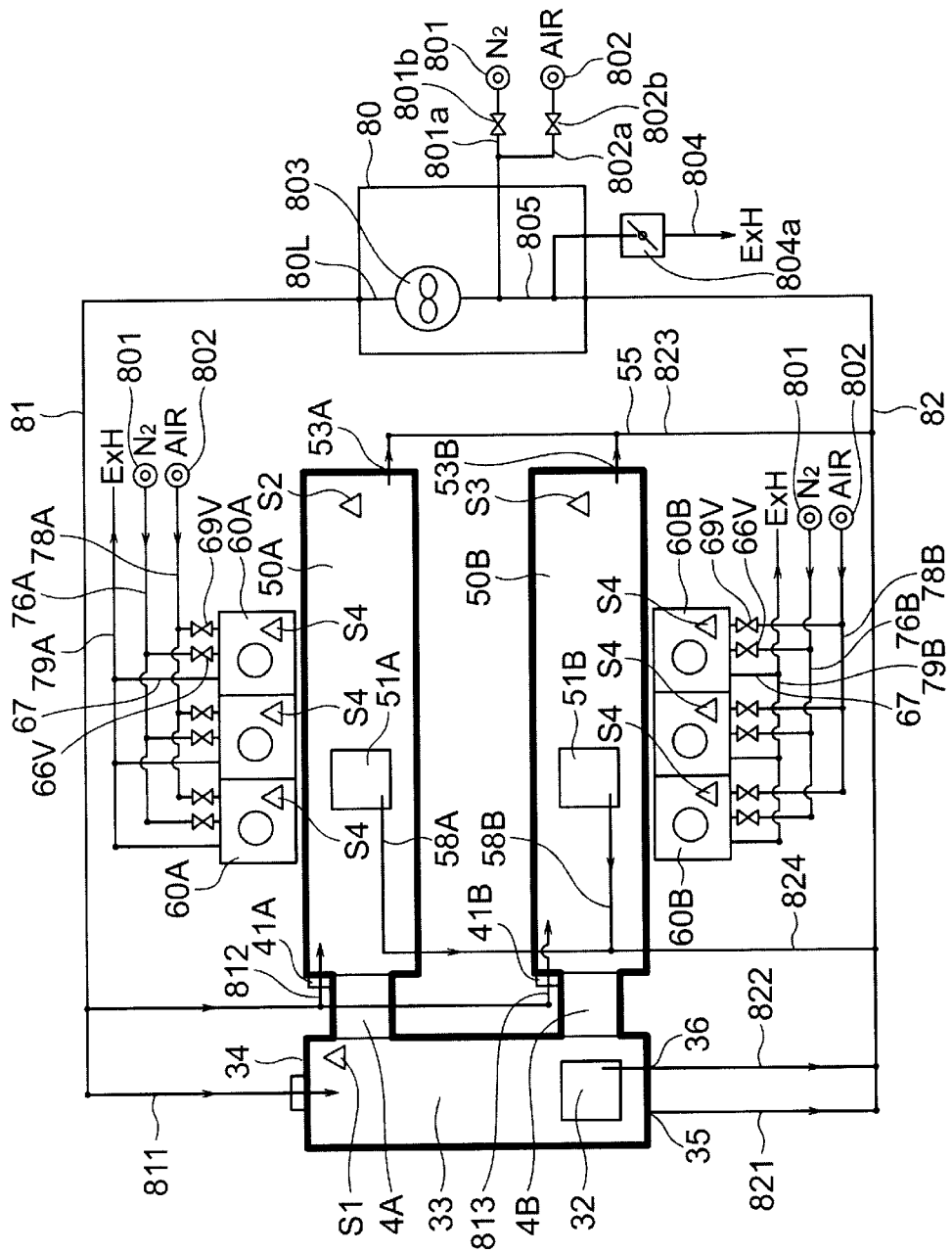
FIG. 5 is a schematic piping system view of the substrate processing system according to the first embodiment.

As illustrated in FIG. 5, the gas supply/circulation system of the substrate processing system 1 includes a gas supply and discharge mechanism 80. A gas supply conduit 81 is connected to a downstream end of an inner conduit 80L provided in the gas supply and discharge mechanism 80. The gas supply conduit 81 is branched into the first, second, and third supply conduit 811, 812, and 813. The first branched supply conduit 811 is connected to the fan filter unit 34. The second branched supply conduit 812 is connected to the fan filter unit 41A. The third branched supply conduit 813 is connected to a fan filter unit 41B.

A first branched exhaust conduit 821 is connected to the exhaust port 35 of the first conveyance space 33. A second branched exhaust conduit 822 is connected to the exhaust port 36 of the first substrate conveyance device 32. A third branched exhaust conduit 823 is connected to the exhaust duct 55 that is continued from the exhaust port 53A of the second conveyance space 50A in the upper portion and the exhaust port 53B of the second conveyance space 50B in the lower portion. A fourth branched exhaust conduit 824 is connected to the exhaust ducts 58A and 58B of the second substrate conveyance device 51A and 51B. The first to fourth branched exhaust conduits 821 to 824 are merged to form an exhaust conduit 82, and are connected to an upstream end of the inner conduit 80L in the gas supply and discharge mechanism 80.

A circulation passage is constituted by the inner conduit 80L, the gas supply conduit 81, the first to third branched supply conduits 811 to 813, the first to fourth branched exhaust conduits 821 to 824, and the exhaust conduit 82. The circulation system through which the atmosphere adjusting gas circulates is constituted by the circulation passage and the conveyance spaces 33, 50A, and 50B.

A damper (not illustrated) may be provided in a part of the first to third branched supply conduits 811 to 813 and the first to fourth branched exhaust conduits 821 to 824. Therefore, it is possible to regulate the balance of the flow rate of the gas flowing in each of the conveyance spaces 33, 50A, and 50B, and the balance of the internal pressure of each of the conveyance spaces 33, 50A, and 50B. The balance of the gas flow rate and the internal pressure may be adjusted by adjusting the rotating number of the fan of the fan filter units 34, 41A, and 41B attached to each of the conveyance spaces 33, 50A, and 50B. That is, the damper and the fan not illustrated function as a pressure adjusting device.

The pressure of the second conveyance space 50A (50B) may be slightly higher than the pressure of the processing unit 60A (60B) facing the second conveyance space 50A (50B). In this manner, it is possible to suppress the second conveyance space 50A (50B) from being contaminated due to chemical flowing from the processing unit 60A (60B) to the second conveyance space 50A (50B).

A nitrogen gas supply pipe 801a connected to a nitrogen gas supply source 801 (N2) and an air supply pipe (circulation system ventilation passage) 802a connected to a clean air supply source 802 (AIR) are connected to the inner conduit 80L of the gas supply and discharge mechanism 80. The nitrogen gas supply source 801 is provided as a factory power provided in a semiconductor manufacturing factory. The clean air supply source 802 may be provided as a factory power provided in a semiconductor manufacturing factory, or may be a suction port for the clean air opened in the clean room. Opening/closing valves 801b and 802b are connected to the nitrogen gas supply pipe 801a and the air supply pipe 802a, respectively.

The gas supply and discharge mechanism 80 includes a blower 803 interposed in the inner conduit 80L, and is able to increase the pressure of the gas flowing into the blower 803 and send the gas to the downstream side. An exhaust pipe 804 connected to a factory exhaust system is connected to the inner conduit 80L of the gas supply and discharge mechanism 80. A damper 804a is provided in the exhaust pipe 804.

The circulation system through which the atmosphere adjusting gas (or clean air serving as a purge gas) circulates is formed of the inner conduit 80L, the gas supply conduit 81, the exhaust conduit 82 (including the branched conduits which are branched from the conduits 81 and 82), and the gas supply and discharge mechanism 80 described above, and the conveyance spaces 33, 50A, and 50B described above.

The atmosphere adjusting gas (or clean air serving as a purge gas) is supplied to the processing units 60A and 60B by a system independent from the circulation system. The nitrogen gas supply source 801 is connected to the nitrogen gas supply ducts 76A and 76B, and the clean air supply source 802 is connected to the air supply ducts 78A and 78B, so that the nitrogen gas and the clean air may be distributed to each of the processing units 60A and 60B.

As illustrated in FIGS. 4 and 5, the atmosphere adjusting gas or the clean air may be selectively supplied to each of the processing units 60A and 60B by the opening/closing valve 66V and 69V attached to each of the processing units 60A and 60B. The exhaust passage 67 of each of the processing units 60A and 60B is connected to the exhaust ducts 79A and 79B, and may discharge the gas in each of the processing units 60A and 60B to the factory exhaust system through the exhaust passage 67 and the exhaust ducts 79A and 79B.

The substrate processing system 1 is provided with a control device 100. The control device 100 is, for example, a computer, and includes a controller 101 and a storage unit 102. The storage unit 102 stores a program that controls various processings performed in the substrate processing system 1. The controller 101 controls the operations of the substrate processing system 1 by reading and executing the program stored in the storage unit 102.

The program may be recorded in a computer-readable recording medium, and installed from the recording medium to the storage unit 102 of the control device 100. The computer-readable recording medium may be, for example, a hard disk (HD), a flexible disk (FD), a compact disk (CD), a magnet optical disk (MO), or a memory card.

In the following, the operation of the substrate processing system 1 will be described.

In the substrate processing system 1, at first, the first substrate conveyance device 32 takes out the substrate W from the container C placed on the container placing portion 20, and places the substrate W on the transfer unit 4A (or 4B). The second substrate conveyance device 51A (or MB) carries the substrate W into the processing unit 60A (or 60B), and then a predetermined liquid processing is performed on the substrate W in the processing unit 60A (or 60B). The processed substrate W is carried out from the processing unit 60A (or 60B) by the second substrate conveyance device 51A (or 51B), and placed on the transfer unit 4A (or 4B). After that, the first substrate conveyance device 32 returns the substrate W placed on the transfer unit 4A (or 4B) to the original container C.

During operating the substrate processing system 1, the opening/closing valve 801b is opened so as to supply the nitrogen gas from the nitrogen gas supply source 801 to the gas supply and discharge mechanism 80, and the gas supply and discharge mechanism 80 sends the nitrogen gas to the gas supply conduit 81 by the blower 803. Therefore, the downflow of the nitrogen gas is formed in the first conveyance space 33 by the fan filter unit 34, and the sideflow of the nitrogen gas is formed in the second conveyance spaces 50A and 50B by the fan filter units 41A and 41B. The air present in the conveyance spaces 33, 50A, and 50B before the supply of the nitrogen gas is expelled by the nitrogen gas, and flows into the gas supply and discharge mechanism 80 through the first to fourth branched exhaust conduits 821 to 824 and the exhaust conduit 82. The air flowing into the gas supply and discharge mechanism 80 is discharged to the factory exhaust system through the exhaust pipe 804. Therefore, the air present in the circulation system formed of the conveyance spaces 33, 50A, and 50B, and the gas supply conduit 81 and the exhaust conduit 82 is substituted with the nitrogen gas. In order to efficiently perform this substitution, a check valve or an opening/closing valve (not illustrated) may be provided in a portion 805 (see, e.g., FIG. 5) of the inner conduit 80L of the gas supply and discharge mechanism 80 to suppress the nitrogen gas supplied from the nitrogen gas supply source 801 from flowing back to the exhaust conduit 82 side.

After the atmosphere in the circulation system is substituted with the nitrogen gas, the blower 803 is continuously operated, so that the nitrogen gas flows in the circulation system described above. In a case where the nitrogen gas is circulated in this manner, it is possible to greatly reduce the amount of nitrogen gas used as compared with a case where the nitrogen gas supplied to the conveyance spaces 33, 50A, and 50B is disposable.

When a large amount of nitrogen gas leaks to the surroundings of the substrate processing system 1, the human body may be in danger. Thus, an oxygen concentration sensor may be provided around the substrate processing system 1 to monitor the oxygen concentration around the substrate processing system 1.

Meanwhile, in each of the processing units 60A and 60B, the opening/closing valve 66V is opened while the opening/closing valve 69V is closed. Accordingly, the nitrogen gas is supplied from the nitrogen gas supply source 801 to each of the processing units 60A and 60B, and thus, the air in each of the processing units 60A and 60B is substituted with the nitrogen gas.

When the insides of each of the processing units 60A and 60B and the circulation system are substituted with the nitrogen gas atmosphere, it is possible to convey and process the substrate W from the container C described above. Completion of substitution with the nitrogen gas atmosphere may be confirmed by an oxygen concentration sensor S1 provided in the first conveyance space 33, an oxygen concentration sensor S2 provided in the second conveyance space 50A, an oxygen concentration sensor S3 provided in the second conveyance space 50B, and the oxygen concentration sensor S4 provided in each of the processing units 60A and 60B.

In order to confirm that the nitrogen gas is reliably circulating in the circulation system, pressure gauges may be provided at at least some of the first to third branched supply conduits 811 to 812 and the first to fourth branched exhaust conduits 821 to 824.

When a worker or an operator enters into the conveyance spaces 33, 50A, and 50B to perform maintenance, it is necessary to set the oxygen concentration in the conveyance spaces 33, 50A, and 50B to an appropriate value such that harmfulness does not occur to the human body due to inhalation of the low oxygen concentration gas.

When the operator shifts the state of the first conveyance space 33 and the second conveyance spaces 50A and 50B to the maintenance mode by manipulating the key cylinder 38 with the operation key (not illustrated), the operation of all the substrate conveyance devices (the first substrate conveyance device 32, and the second substrate conveyance devices 51A and 51B) is stopped. Further, the opening/closing valve 801b is closed and the opening/closing valve 802b is opened, and thus, the clean air as the purge gas is supplied from the clean air supply source 802 to the inner conduit 80L of the gas supply and discharge mechanism 80 and the gas is discharged from the exhaust pipe 804. Therefore, the nitrogen gas present in the circulation system is substituted with the clean air. When the oxygen concentration detected by the oxygen concentration sensors S1 to S3 is detected to reach the safe oxygen concentration to the human body, for example, 19.5% or more, the electromagnetic locks 39 and 57 which are the lock mechanisms of each of the maintenance doors 37, 56A and 56B are unlocked. Therefore, the operator may open the maintenance doors 37, 56A, and 56B and enter into the conveyance spaces 33, 50A, and 50B. The locking/unlocking control of the electromagnetic locks 39 and 57 may be performed by an independent safety device or by a safety device function provided to the control device 100.

In this case, the inside of the processing units 60A and 60B may be maintained as the nitrogen gas atmosphere.

When it is desired to maintain a part of the plurality of processing units 60A and 60B, for example, one processing unit 60A, the key cylinder 73 provided in the maintenance door 72 of the processing unit 60A is operated to switch the state of the processing unit 60A to the maintenance mode. In this manner, the processing unit 60A stops in that state. The opening/closing valve 66V is closed and the opening/closing valve 69V is opened, and thus, the supply of the nitrogen gas into the processing unit 60A is stopped and the supply of the clean air is started. When it is detected by the oxygen concentration sensor S4 that the oxygen concentration in the processing unit 60A reaches an oxygen concentration safe for the human body, the electromagnetic lock 74 of the processing unit 60A is unlocked. Thus, it is possible to open the maintenance door 72. The locking/unlocking control of the electromagnetic lock 74 may be performed by an independent safety device or by a safety device function provided to the control device 100.

The manipulation of opening maintenance doors 72 of a part of the plurality of processing units 60A, 60B may be performed while conveying the substrate W into the conveyance spaces 33, 50A, and 50B.

According to the embodiment, the amount of consumption of nitrogen gas may be reduced by reusing the nitrogen gas supplied to the conveyance spaces 33, 50A, and 50B for atmosphere adjustment. Therefore, it is possible to reduce the maintenance cost of the substrate processing system.

Further, according to the embodiment, it is possible to secure the safety of the operator since the allowance of the opening/closing of the maintenance door is performed based on the detected oxygen concentration.

In the embodiment, the atmosphere adjusting gas is supplied to the first conveyance space 33, the second conveyance space 50A in the upper portion, and the second conveyance space 50B in the lower portion through the fan filter units 34, 41A, and 41B, but the present disclosure is not limited thereto. For example, when the gas supply and discharge mechanism 80 has a sufficient driving force (air volume and wind pressure) to form the flow of the atmosphere adjusting gas required in the conveyance spaces 33, 50A, and 50B, a filter unit without a fan may be used instead of the fan filter units 34, 41A, and 41B.

Further, in the embodiment (hereinafter, also referred to as a "first embodiment" for distinction), all the conveyance spaces 33, 50A, and 50B provided in the substrate processing system 1 and the conduits 81, 82, 80L, 811, 812, 821, 822, 823, and 824 connected to the conveyance spaces form a single circulation system, but the present disclosure is not limited thereto. For example, as in a second embodiment illustrated in FIG. 6, a circulation system (hereinafter, referred to as a "first circulation system") constituted by the first conveyance space 33 and the conduits 81N, 82N, and 811 connected to the first conveyance space 33 may be separated from the single circulation system described above. In this case, a gas supply and discharge mechanism 80N dedicated to the first circulation system is provided. The configuration of the gas supply and discharge mechanism 80N may be the same as the configuration of the gas supply and discharge mechanism 80 illustrated in the right side in FIG. 6. In this case, a second circulation system is constituted by the second conveyance spaces 50A and 50B, the conduits 81, 82, 80L, 812, 823, and 824 connected to the second conveyance spaces 50A and 50B, and the gas supply and discharge mechanism 80. In the second embodiment illustrated in FIG. 6, the same components as those provided in the first embodiment are denoted by the same reference numerals, and the redundant description thereof is omitted.

Figure 6:
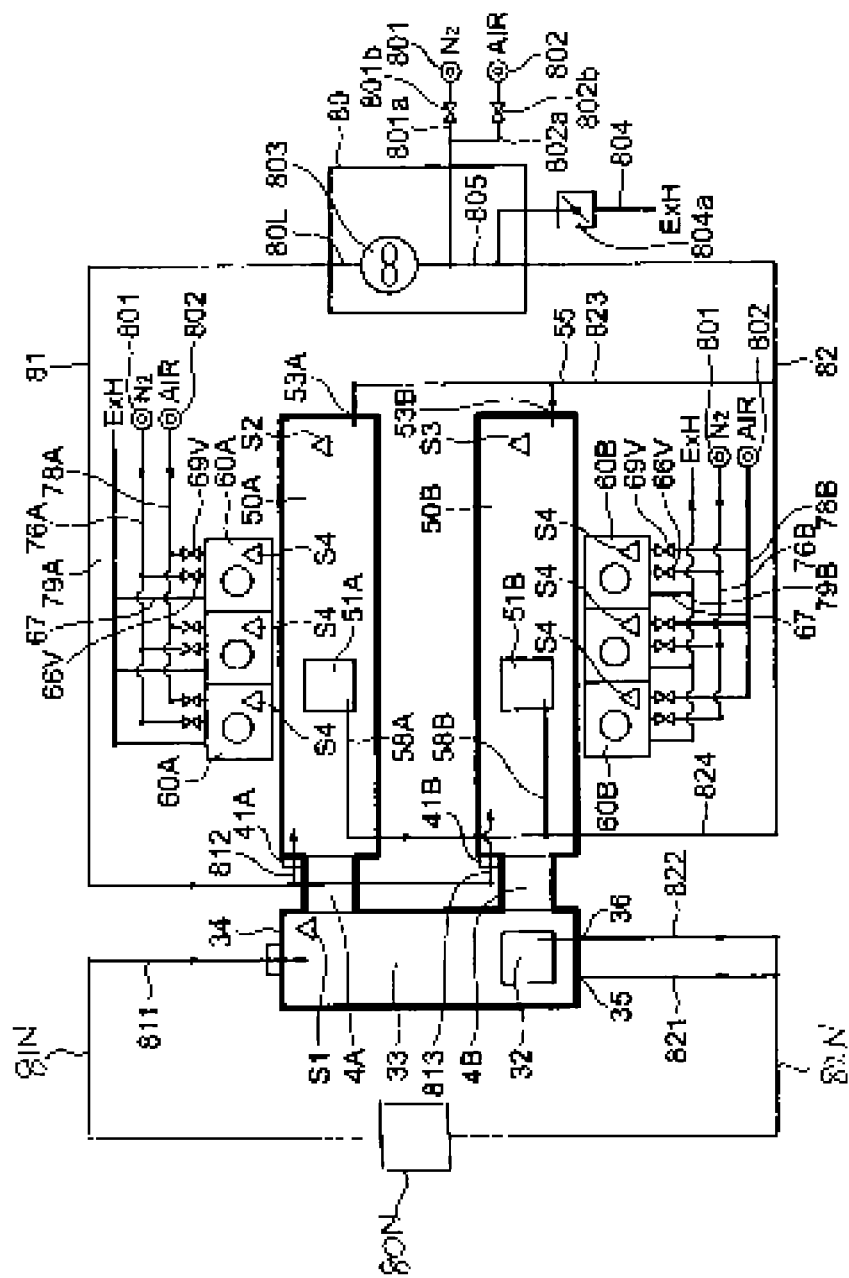
FIG. 6 is a schematic piping system view of a substrate processing system according to a second embodiment.

The second embodiment illustrated in FIG. 6 has following advantages. The maximum cross-sectional area of the gas flow passages (e.g., ducts and pipes) may be decreased by dividing the circulation system of the substrate processing system 1 into the first circulation system and the second circulation system to reduce the gas flow rate per one circulation system. Therefore, it is possible to prevent or suppress the total size of the substrate processing system 1 from increasing. In a case where the single circulation system illustrated in FIG. 5 is used, for example, it is necessary to make the cross-sectional area of the gas supply conduit 81 substantially large in order to reduce the pressure loss while maintaining the gas circulation flow rate per time (e.g., the unit is $m^3/min$) sufficiently large.

Further, when the shutter 71 of the processing units 60A (60B) is opened, the second conveyance space 50A (50B) communicates with the inner space of the processing unit 60A (60B). Therefore, the atmosphere (e.g., chemical atmosphere) in the processing unit 60A (60B) flows out into the second conveyance space 50A (50B), so that the second conveyance space 50A (50B) may be contaminated. In a case where it is required to suppress the chemical concentration in the atmosphere in the second conveyance space 50A (50B) to a predetermined threshold value, it is necessary to raise the discharge amount of the existing atmosphere through the exhaust pipe 804 and the supply amount of a new atmosphere adjusting gas from the nitrogen gas supply source 801. Meanwhile, the first conveyance space 33 is hardly contaminated by substances that intrude from the outside. Therefore, it is possible to suppress the discharge amount of the gas from the first circulation system and the supply amount of the new nitrogen gas to the first circulation system to be low. That is, depending on the required conditions, it is possible to suppress the supply amount of the nitrogen gas to be low as compared with the case where the substrate processing system 1 includes a single circulation system. Further, depending on the required conditions, it is possible to reduce the power consumption of fans and blowers-type 34, 35a, 36a, 54A, 54B, and 56 as compared with the case where the substrate processing system 1 includes a single circulation system.

Further, by adjusting the atmosphere of the first conveyance space 33 and the second conveyance spaces 50A and 50B using the different circulation systems (first circulation system and second circulation system), both of the conveyance spaces may be adjusted to the different atmospheres. For example, it is possible to flexibly respond to a request that, for example, only the second conveyance spaces 50A and 50B are required to have a particularly low oxygen concentration.

Regarding another embodiment (third embodiment) that adjusts the atmosphere of the first conveyance space and the second conveyance space using the different circulation systems (first circulation system and second circulation system) as in the second embodiment will be described with reference to FIG. 7. In the third embodiment illustrated in FIG. 7, the same components as those provided in the first and the second embodiments are denoted by the same reference numerals, and the redundant description thereof is omitted.

In the third embodiment, the conveyance space that is divided into two spaces (second conveyance spaces 50A and 50B) partitioned vertically in the first and the second embodiments is a single space 50C (second conveyance space 50C). The second conveyance space 50C faces all processing units 16. A single second substrate conveyance device 51C capable of transferring the substrate W among all the processing units 16 is provided in the second conveyance space 50C. In the third embodiment, the configuration of the first conveyance space 33 and the first substrate conveyance device 32 therein may be the same as those of the first and the second embodiment described above. In the third embodiment, one transfer unit 4C is provided between the first conveyance space 33 and the second conveyance space 50C. A transfer unit dedicated to a substrate to be processed and a transfer unit dedicated to a processed substrate may be provided between the first conveyance space 33 and the second conveyance space 50C.

Figure 7:
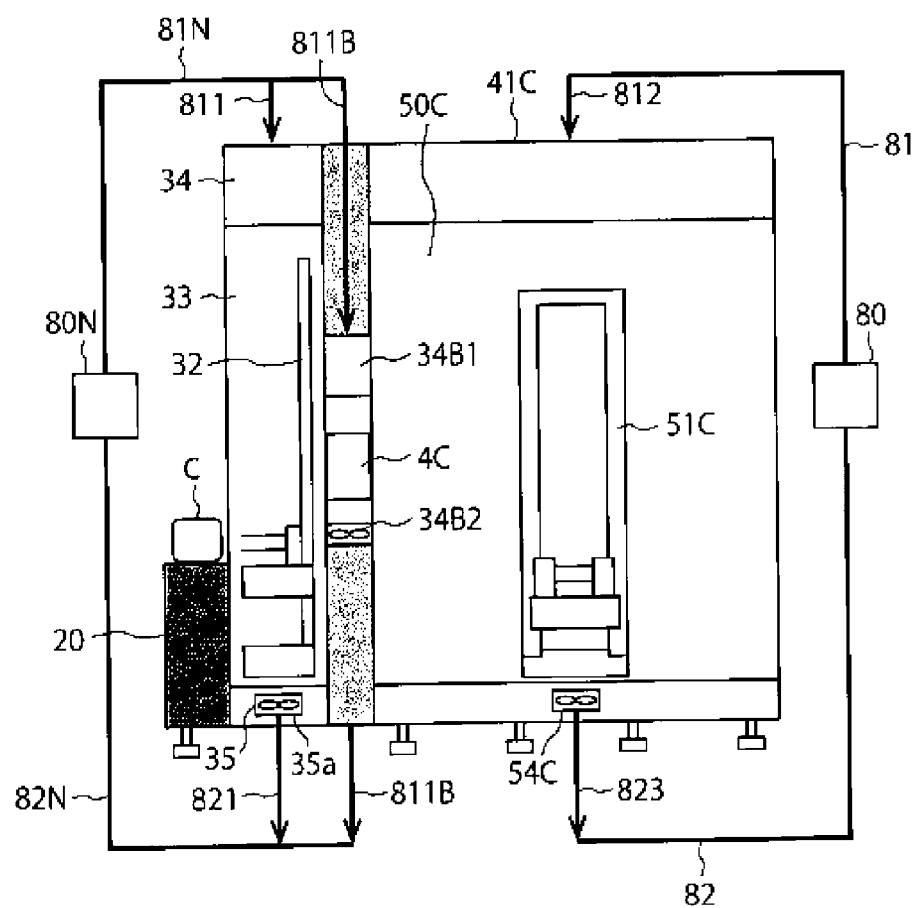
FIG. 7 is a schematic cross-sectional view including a schematic piping system view of a substrate processing system according to a third embodiment, which is a schematic cross-sectional view of the substrate processing system cut off at a position similar to that of FIG. 2.

The first circulation system of the third embodiment illustrated in FIG. 7 is different from the first circulation system of the second embodiment illustrated in FIG. 6 in the following aspects. A branches passage 811B is branched from the circulation line (conduits 81N, 811, 821, and 82N) that starts from the gas supply and discharge mechanism 80N and returns to the gas supply and discharge mechanism 80, and configured to return to the circulation line. The transfer unit 4C is interposed in the branched passage 811B. A fan filter unit 34B1 is provided on a ceiling portion of the transfer unit 4C. A suction fan 34B2 is provided on a floor portion of the transfer unit 4C. The fan filter unit 34B1 filters the atmosphere adjusting gas flowing from the branched passage 811B, and then ejects it downward into the inner space of the transfer unit 4C. The suction fan 34B2 sucks the atmosphere in the inner space of the transfer unit 4C and sends it to the branched passage 811B. That is, the gas flowing through the branched passage 811B is driven by the fan filter unit 34B1 and the suction fan 34B2.

The second circulation system of the third embodiment illustrated in FIG. 7 is different from the second circulation system of the second embodiment illustrated in FIG. 6 in the following aspects. Downflow is formed in the second conveyance space 50C, instead of the sideflow. That is, a fan filter unit 41C is provided on a ceiling portion of a portion (constituted by a plurality of panels) that partition the second conveyance space 50C among the housing of the substrate processing system 1, and a suction fan MC is provided on a floor portion. The fan filter unit 41C filters the atmosphere adjusting gas flowing from the circulation line (conduit 812)

of the second circulation system, and then ejects it downward into the second conveyance space 50C. The suction fan MC sucks the atmosphere in the second conveyance space 50C, and sends it to the circulation line (conduit 823) of the second circulation system. That is, the gas flowing through the conduits (81, 812, 823, or 82) that constitute the second circulation system is driven by the fan filter unit 41C and the suction fan MC.

According to the third embodiment described above, advantages substantially the same as those of the second embodiment may be obtained.

The internal pressure of each of the first conveyance space 33, the second conveyance space 50C, and the inner space of the transfer unit 4C may be controlled by regulating the balance between the force (e.g., varied with the rotating number of the fan filter units 34, 34B1, and 41C) that pushes gas to the each space and the force (e.g., varied with the rotating number of the suction fan 35a, 34B2, and MC) that sucks gas from the each space. The pressure in the inner space of the transfer unit 4C may be set to higher than the pressure in the first conveyance space 33 and also the pressure in the second conveyance space 50C. The transfer unit 4C is a place where the substrate W may stay for the longest time while the substrate W is taken out from the container C and returned to the container C. It is possible to greatly reduce the possibility of floating substances such as dust adhering to the substrate W placed on the transfer unit 4C by making the pressure in the second conveyance space 40 highest.

In all the first to third embodiments, the blower 803 in the gas supply and discharge mechanism 80 may be omitted in a case where the fan filter unit, the suction fan, or the like is capable of generating sufficient driving force to form a circulating flow in the circulation system.

In all the embodiments described in the present specification, the first conveyance space 33, the second conveyance spaces 50A, 50B, and 50C, and the inner space of the transfer units 4A, 4B, and 4C that are connected with each other may be considered as one conveyance space. Further, in this case, the first conveyance space may be considered as the first conveyance region 33 of the conveyance space, the second conveyance space may be considered as the second conveyance regions 50A, 50B, and 50C of the conveyance space, and the inner space of the transfer units 4A, 4B, and 4C may be considered as a communication region of the conveyance space, that is a communication region that communicates the first conveyance region 33 and the second conveyance regions 50A, 50B, and 50C. Further, among a circulation passage provided in the substrate processing system 1, a portion that is connected to the first conveyance region 33 and forms the circulation passage by itself may be considered as a first circulation passage portion, and a portion that is connected to the second conveyance regions 50A, 50B, and 50C and forms the circulation passage by itself may be considered as a second circulation passage portion.

The atmosphere adjusting gas may also be an inert gas other than the nitrogen gas, and may be a dry air having a lower humidity than the clean air in the clean room, or a carbon dioxide gas or the like.

The gas supply and discharge mechanism 80 may be provided in the housing of the substrate processing system 1, or may be provided outside.

In the embodiment described above, the processing units 60A and 60B are liquid processing units including the nozzle 64 and the cup body 65, but the present disclosure is not limited thereto. The processing units 60A and 60B may be, for example, drying processing units that perform drying processing of a substrate using a supercritical fluid, or surface processing units that perform surface modification processing.

In the substrate processing system 1, the processed substrate W is not limited to a semiconductor wafer, but may be various types of substrates such as a glass substrate, a ceramic substrate for manufacturing a semiconductor device.

According to the embodiments of the present disclosure, since the atmosphere adjusting gas that adjusts the atmosphere in the conveyance space is circulated and used repeatedly, and thus the amount of the atmosphere adjusting gas used may be reduced, so that the burden on an operating cost of the substrate processing apparatus and factory power may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a container carrying in/out section on which a substrate conveyance container accommodating a substrate is placed;
   a processing chamber configured to process the substrate;
   a conveyance space through which the substrate is conveyed between the container carrying in/out section and the processing chamber;
   a substrate conveyor configured to convey the substrate between the container carrying in/out section and the processing chamber through the conveyance space;
   a first gas supply passage configured to supply an atmosphere adjusting gas to the processing chamber;
   a first gas discharge passage configured to discharge the atmosphere adjusting gas from the processing chamber;
   a circulation passage connected to the conveyance space and configured to return the atmosphere adjusting gas flowing out from the conveyance space to the conveyance space;
   a second gas supply passage configured to supply the atmosphere adjusting gas to a circulation system constituted by the conveyance space and the circulation passage; and
   a second gas discharge passage configured to discharge the atmosphere adjusting gas from the circulation system.

2. The substrate processing apparatus of claim 1, further comprising:
   a pressure regulator provided in the circulation system and configured to regulate a pressure in the conveyance space.

3. The substrate processing apparatus of claim 2, wherein the pressure regulator is operated such that the pressure in the conveyance space is maintained to be higher than a pressure in the processing chamber.

4. The substrate processing apparatus of claim 3, wherein the pressure regulator includes a fan or a damper.

5. The substrate processing apparatus of claim 4, wherein the atmosphere adjusting gas has an oxygen concentration lower than that of air.

6. The substrate processing apparatus of claim 2, wherein the pressure regulator includes a fan or a damper.

7. The substrate processing apparatus of claim 1, wherein the atmosphere adjusting gas has an oxygen concentration lower than that of air.

8. The substrate processing apparatus of claim 7, further comprising:
   a ventilation passage configured to introduce air into the processing chamber to substitute an atmosphere in the processing chamber from the atmosphere adjusting gas to an air atmosphere.

9. The substrate processing apparatus of claim 8, wherein the processing chamber includes a maintenance door, and an inside of the processing chamber is opened to an atmosphere around the substrate processing apparatus by opening the maintenance door.

10. The substrate processing apparatus of claim 9, further comprising:
    an oxygen concentration sensor configured to detect an oxygen concentration of the inside of the processing chamber;
    a lock attached to the maintenance door and configured to lock and unlock the maintenance door; and
    a safety controller configured to unlock the lock in a case where the oxygen concentration detected by the oxygen concentration sensor is higher than a predetermined threshold value.

11. The substrate processing apparatus of claim 7, further comprising:
    a circulation system ventilation passage configured to introduce air into the circulation system to substitute an atmosphere in the circulation system from the atmosphere adjusting gas to an air atmosphere.

12. The substrate processing apparatus of claim 11, further comprising:
    a maintenance door configured to access the conveyance space,
    wherein the conveyance space is opened to an atmosphere around the substrate processing apparatus by opening the maintenance door.

13. The substrate processing apparatus of claim 12, further comprising:
    an oxygen concentration sensor configured to detect an oxygen concentration in the space inside the conveyance space;
    a lock attached to the maintenance door and configured to lock and unlock the maintenance door; and
    a safety controller configured to unlock the lock in a case where the oxygen concentration detected by the oxygen concentration sensor is higher than a predetermined threshold value.

14. The substrate processing apparatus of claim 1, wherein the conveyance space includes a first conveyance region, a second conveyance region, and a communication region that communicates the first conveyance region and the second conveyance region,
    the substrate conveyor includes a first substrate mover provided in the first conveyance region and a second substrate mover provided in the second conveyance region,
    the substrate is capable of being transferred between the first substrate mover and the second substrate mover in the communication region, and
    the circulation passage includes a first circulation passage portion connected to the first conveyance region and configured to return the atmosphere adjusting gas flowing out from the first conveyance region to the first conveyance region, and a second circulation passage portion connected to the second conveyance region and configured to return the atmosphere adjusting gas flowing out from the second conveyance region to the second conveyance region.

15. The substrate processing apparatus of claim 14, wherein an arm capable of holding a substrate is provided in the communication region, the first substrate mover is configured to transfer the substrate to and from the arm, and the second substrate mover is configured to transfer the substrate to and from the arm.

16. The substrate processing apparatus of claim 15, further comprising:
    a pressure regulator provided in the circulation system and configured to regulate a pressure in the conveyance space,
    wherein the pressure regulator is operated such that a pressure in the communication region in the conveyance space is maintained to be higher than a pressure in the first conveyance region and also higher than a pressure in the second conveyance region.

* * * * *